(12) United States Patent
Burton

(10) Patent No.: US 11,569,198 B2
(45) Date of Patent: Jan. 31, 2023

(54) STACKED SEMICONDUCTOR DIE ARCHITECTURE WITH MULTIPLE LAYERS OF DISAGGREGATION

(71) Applicant: Intel Corporation, Santa Clara, CA (US)

(72) Inventor: Edward Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 16/646,974

(22) PCT Filed: Jan. 3, 2018

(86) PCT No.: PCT/US2018/012170
§ 371 (c)(1),
(2) Date: Mar. 12, 2020

(87) PCT Pub. No.: WO2019/135739
PCT Pub. Date: Jul. 11, 2019

(65) Prior Publication Data
US 2020/0219843 A1 Jul. 9, 2020

(51) Int. Cl.
*H01L 25/00* (2006.01)
*H01L 23/00* (2006.01)

(52) U.S. Cl.
CPC ............ *H01L 25/00* (2013.01); *H01L 24/16* (2013.01); *H01L 2224/16145* (2013.01)

(58) Field of Classification Search
None
See application file for complete search history.

(56) References Cited

U.S. PATENT DOCUMENTS

| 8,008,764 | B2 * | 8/2011 | Joseph | H01L 25/0652 |
| | | | | 257/E23.085 |
| 8,349,653 | B2 * | 1/2013 | Parvarandeh | H01L 24/97 |
| | | | | 438/109 |
| 8,420,433 | B2 * | 4/2013 | Jackson | H01L 27/1469 |
| | | | | 438/66 |

(Continued)

OTHER PUBLICATIONS

International Search Report and Written Opinion for International Patent Application No. PCT/US2018/012170, dated Oct. 2, 2018, 11 pgs.

(Continued)

*Primary Examiner* — Telly D Green
(74) *Attorney, Agent, or Firm* — Schwabe, Williamson & Wyatt, P.C.

(57) ABSTRACT

Stacked semiconductor die architectures having one or more base dies and techniques of forming such architectures are described. The stacked semiconductor die architectures may be included in or used to form semiconductor packages. A stacked semiconductor die architecture can include: (i) one or more base dies (e.g., at least one disaggregated base die, at least one monolithic base die, etc.); and (ii) a carrier wafer having multiple stacked semiconductor dies embedded in the carrier wafer, where the carrier wafer is on the one or more base dies and where one or more interconnect structures (e.g., wires, bumps, microbumps, pillars, etc.) couple the one or more base dies to the carrier wafer and/or the stacked semiconductor dies.

14 Claims, 7 Drawing Sheets

(56) References Cited

U.S. PATENT DOCUMENTS

| | | | | |
|---|---|---|---|---|
| 8,629,475 | B2* | 1/2014 | Tischler | H01L 24/96 257/98 |
| 9,076,754 | B2* | 7/2015 | Hung | H01L 23/42 |
| 9,402,312 | B2* | 7/2016 | Shen | H01L 21/76898 |
| 9,583,415 | B2* | 2/2017 | Yu | H01L 23/36 |
| 9,607,919 | B2* | 3/2017 | Lee | H01L 24/97 |
| 9,812,406 | B2* | 11/2017 | Shen | H01L 21/481 |
| 9,887,166 | B2* | 2/2018 | Katkar | H01L 23/562 |
| 10,636,721 | B2* | 4/2020 | Kim | H01L 23/3107 |
| 2004/0090756 | A1* | 5/2004 | Ho | H01L 25/0655 361/767 |
| 2009/0267238 | A1* | 10/2009 | Joseph | H01L 23/49833 438/109 |
| 2009/0311829 | A1 | 12/2009 | Yang et al. | |
| 2011/0049694 | A1* | 3/2011 | Chandrasekaran | H01L 24/97 257/686 |
| 2011/0300668 | A1* | 12/2011 | Parvarandeh | H01L 24/19 438/107 |
| 2012/0091580 | A1* | 4/2012 | Jeong | H01L 24/14 257/737 |
| 2014/0001639 | A1* | 1/2014 | Hiraishi | H01L 25/0657 257/773 |
| 2014/0048928 | A1* | 2/2014 | Li | H01L 23/49811 257/737 |
| 2014/0091463 | A1* | 4/2014 | Yu | H01L 23/49838 257/738 |
| 2014/0264842 | A1 | 9/2014 | Lin et al. | |
| 2015/0262902 | A1* | 9/2015 | Shen | H01L 23/147 438/107 |
| 2015/0327367 | A1* | 11/2015 | Shen | H01L 24/97 361/767 |
| 2015/0340303 | A1* | 11/2015 | Oh | H01L 21/56 257/692 |
| 2016/0013147 | A1 | 1/2016 | Cheng et al. | |
| 2016/0276294 | A1* | 9/2016 | Katkar | H01L 21/561 |
| 2016/0297671 | A1* | 10/2016 | Pahl | B81B 7/0048 |
| 2017/0018510 | A1* | 1/2017 | Shen | H01L 23/3128 |
| 2017/0084539 | A1* | 3/2017 | Gao | H01L 25/50 |
| 2017/0084551 | A1* | 3/2017 | Limb | H01L 24/16 |
| 2017/0110407 | A1* | 4/2017 | Chaware | H01L 25/0652 |
| 2018/0130717 | A1* | 5/2018 | Shen | H01L 23/481 |
| 2020/0043817 | A1* | 2/2020 | Shen | H01L 23/055 |

OTHER PUBLICATIONS

International Preliminary Report on Patentability for International Patent Application No. PCT/US2018/012170, dated Jul. 16, 2020, 8 pgs.

* cited by examiner form semiconductor packages. In one embodiment, a single monolithic base die is divided or disaggregated into a plurality of individually tested base dies. In this
STACKED SEMICONDUCTOR DIE ARCHITECTURE WITH MULTIPLE LAYERS OF DISAGGREGATION

CROSS-REFERENCE TO RELATED APPLICATION

This patent application is a U.S. National Phase Application under 35 U.S.C. § 371 of International Application No. PCT/US2018/012170, filed Jan. 3, 2018, entitled "STACKED SEMICONDUCTOR DIE ARCHITECTURE WITH MULTIPLE LAYERS OF DISAGGREGATION," which designates the United States of America, the entire disclosure of which is hereby incorporated by reference in its entirety and for all purposes.

BACKGROUND

Field

Embodiments described herein relate to stacked semiconductor die architectures for semiconductor packages. More specifically, embodiments described herein relate to stacked semiconductor die architectures that include one or more base dies.

Background Information

High performance computing applications, such as servers, are driving an increase in the sizes of stacked semiconductor die architectures. This has created a trend towards fabrication of stacked semiconductor die architectures that include large numbers of stacked semiconductor dies on a single base die, which can be costly. Furthermore, as increasingly larger numbers of stacked semiconductor dies are placed or mounted on a single base die, the yield of the base die diminishes.

BRIEF DESCRIPTION OF THE DRAWINGS

Embodiments described herein are illustrated by way of example and not limitation in the figures of the accompanying drawings, in which like references indicate similar features.

DETAILED DESCRIPTION

Figure 1:
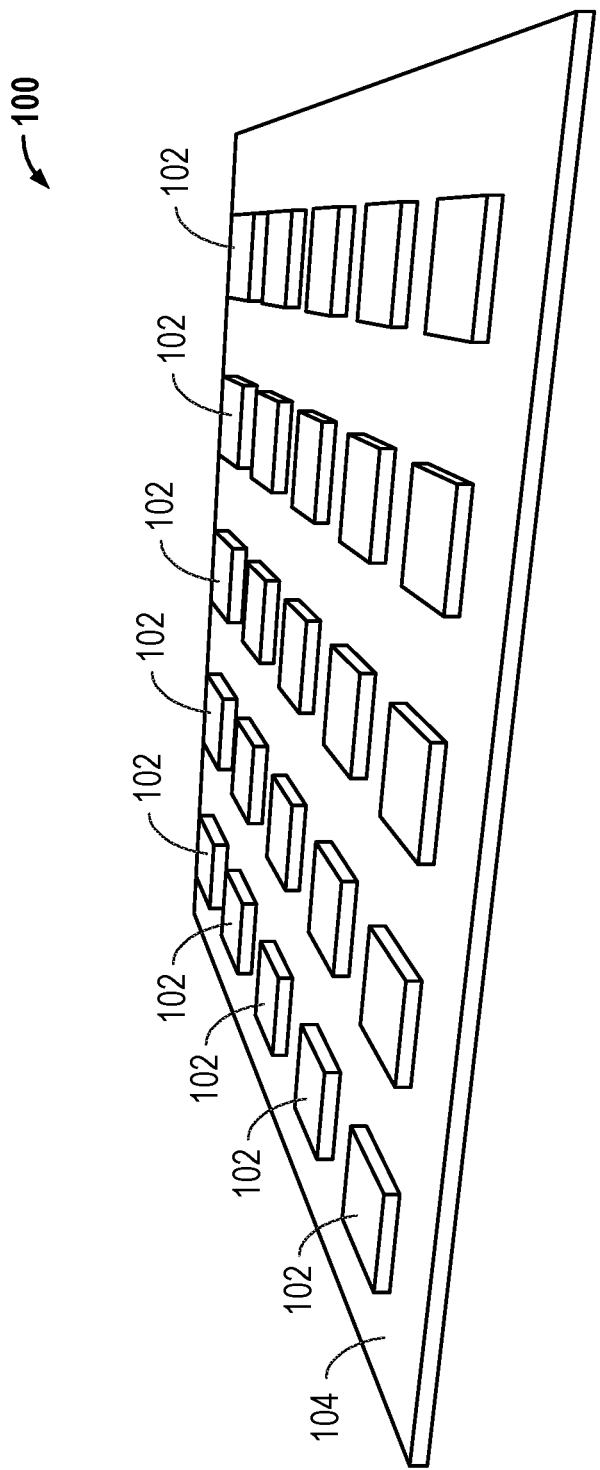
FIG. 1 is an isometric view of a plurality of stacked semiconductor dies on a conventional monolithic base die.

Embodiments described herein are directed to stacked semiconductor die architectures that include one or more base dies (e.g., at least one disaggregated base die, at least one monolithic base die, etc.) and techniques of forming such architectures. Embodiments of the stacked semiconductor die architectures described herein may be included in or used to form semiconductor packages. In one embodiment, a single monolithic base die is divided or disaggregated into a plurality of individually tested base dies. In this embodiment, each of the individually tested base dies is referred to herein as a disaggregated base die. In one embodiment, one or more additional semiconductor dies are mounted on one or more base dies (e.g., one or more disaggregated base dies, at least one monolithic base die, etc.). The additional semiconductor die(s) may be referred to herein as stacked semiconductor dies. In other words, and in one embodiment, a stacked semiconductor die architecture includes: (i) at least one base die (e.g., one or more disaggregated base dies, at least one monolithic base die, etc.); and (ii) at least one stacked semiconductor die on the at least one base die.

As used herein, the term "interconnect structures" comprises mechanical and/or electrical connections (e.g., wires, etc.) and interconnects (e.g., bumps, microbumps, pillars, etc.).

In some embodiments, a stacked semiconductor die architecture includes a carrier wafer having one or more cavities formed therein. In one embodiment, the carrier wafer is a mechanical carrier wafer (e.g., a carrier wafer that does not include any interconnect structures and/or any active or passive semiconductor devices, etc.). In one embodiment, the carrier wafer is a passive carrier wafer (e.g., a carrier wafer that includes at least one interconnect structure and/or at least one passive semiconductor device but no active semiconductor device, etc.). Cavities may be formed using any suitable techniques (e.g., laser drilling, etching, etc.). Cavities include, but are not limited, holes formed through the carrier wafer. Semiconductor dies may be placed into the cavities of the carrier wafer such that the semiconductor dies are embedded in the carrier wafer. Top and/or bottom sides of the semiconductor dies may be co-planar with top and/or bottom sides of the carrier wafer. In one embodiment, a carrier wafer having stacked semiconductor dies embedded therein is mounted on one or more base dies (e.g., one or more disaggregated base dies, one or more monolithic base dies, etc.). Furthermore, interconnect structures (e.g., wires, bumps, microbumps, pillars, etc.) may be used to couple the one or more base dies to the carrier wafer and/or the stacked semiconductor dies. Thus, and in one embodiment, a stacked semiconductor die architecture includes: (i) one or more base dies (e.g., one or more disaggregated base dies, at least one monolithic base die, etc.); and (ii) a carrier wafer having one or more stacked semiconductor dies embedded in the carrier wafer, where the carrier wafer is on the one or more base dies and where one or more interconnect structures (e.g., wires, bumps, microbumps, pillars, etc.) couple the one or more base dies to the carrier wafer and/or the stacked semiconductor dies.

Numerous advantages are attributable to the embodiments described herein. One or more of these advantages are evident from comparing at least one conventional stacked semiconductor die architecture to embodiments of stacked semiconductor die architectures described herein. FIG. 1 illustrates a conventional stacked semiconductor die architecture 100. As shown, the conventional stacked semiconductor die architecture 100 includes a plurality of stacked semiconductor dies 102 mounted on a single monolithic base die 104. One problem associated with the conventional architecture 100 is that as the number of stacked semiconductor dies 102 placed or mounted on the monolithic base die 104 increases, the monolithic base die 104's yield decreases. Another problem associated with the conventional architecture 100 also exists because of the conventional assembly operation used to mount the stacked semiconductor dies 102 onto the monolithic base die 104. This conventional assembly operation requires: (i) carefully aligning every stacked semiconductor die 102; and (ii) heating the stacked semiconductor dies 102 and the monolithic base die 104 to reflow and join interconnect structures (e.g., wires, bumps, microbumps, pillars, etc.) between the stacked semiconductor dies 102 and the monolithic base die 104. Consequently, the conventional assembly operation used to mount the dies 102 onto the monolithic base die 104 includes a joining operation for each of the stacked semiconductor dies 102. These multiple joining operations can, collectively, be a time-intensive exercise, which can in turn increase the time required to complete the entire assembly operation for the conventional architecture 100. In short, the multiple joining operations required for the conventional architecture 100 are a time-intensive operation that can undesirably increase fabrication time of the conventional architecture 100.

Figure 2A:
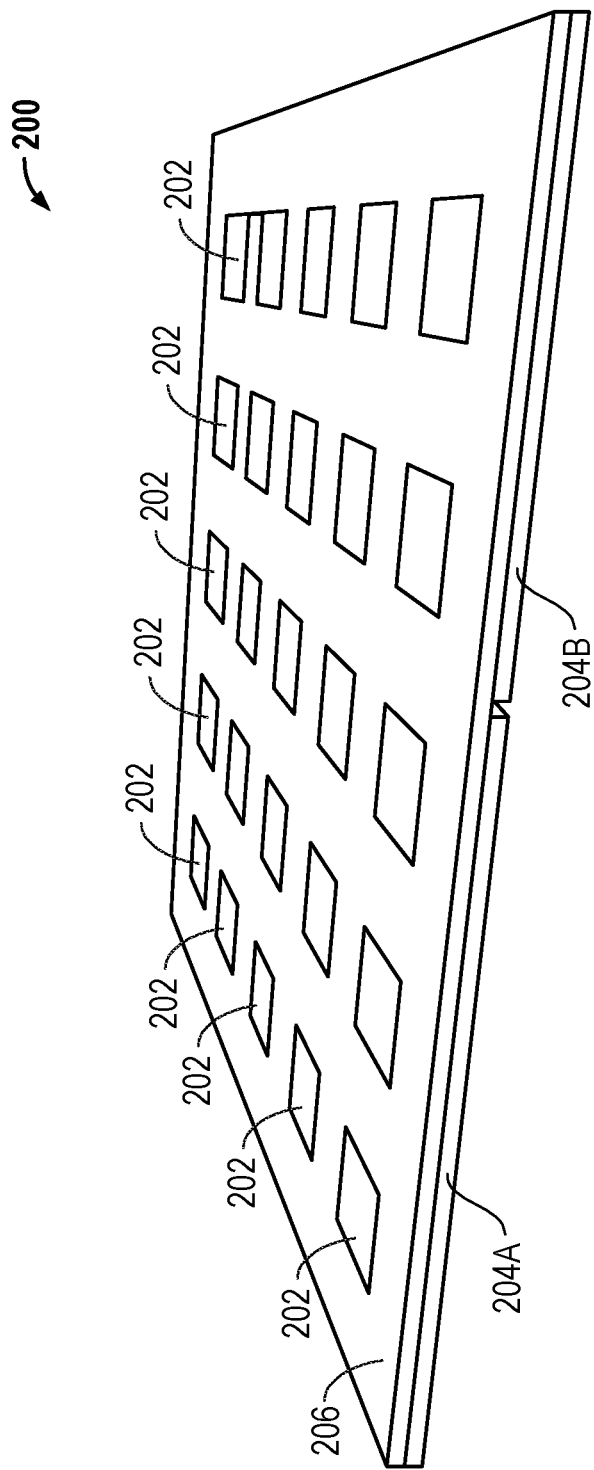
FIGS. 2A-2B are isometric views of a plurality of stacked semiconductor dies on one or more base dies that are coupled to each other by a carrier wafer having the plurality of stacked dies embedded therein, according to one or more embodiments.

Reference is now made to FIG. 2A, which illustrates a stacked semiconductor die architecture 200 in accordance with an embodiment. As shown, the architecture 200 includes a carrier wafer 206 (with cavities formed therein), a plurality of stacked semiconductor dies 202, and two disaggregated base dies 204A-B. The cavities formed in the carrier wafer 206 include, but are not limited, holes formed straight through the carrier wafer 206. A surface area of the carrier wafer 206 can be equal to or larger than surface areas of the plurality of stacked semiconductor dies 202 and/or surface areas of the disaggregated base dies 204A-B. Also, surface areas of the two disaggregated base dies 204A-B can be equal to or larger than surface areas of the plurality of stacked semiconductor dies 202. For a first example, a surface area of the disaggregated base die 204A is equal to or larger than a surface area of one of the plurality of stacked semiconductor dies 202. For a second example, a surface area of the carrier wafer 206 can be equal to or larger than a surface area of the disaggregated base die 204A. For a third example, a surface area of the carrier wafer 206 is equal to or greater than a total surface area of the two disaggregated base dies 204A-B. For a fourth example, a surface area of the disaggregated base die 204A is equal to or greater than a total surface area of the plurality of stacked semiconductor dies 202. For a fifth example, a surface area of the disaggregated base die 204B is equal to or greater than a total surface area of the plurality of stacked semiconductor dies 202. For a sixth example, a total surface area of the disaggregated base dies 204A-B is equal to or greater than a total surface area of the plurality of stacked semiconductor dies 202. It is to be appreciated that other examples are possible.

As explained above, the conventional architecture 100 shown in FIG. 1 includes a monolithic base die 104 whose yield decreases as the number of stacked semiconductor dies 102 placed or mounted on the monolithic base die 104 increases. The architecture 200 can assist with minimizing or eliminating this problem. This is because, for one embodiment, each of disaggregated base dies 204A-B includes fewer stacked semiconductor dies 202 than the monolithic base die 104. This is also because, for one embodiment, the carrier wafer 206 includes one or more passive semiconductor devices that assist with improving the yield of at least one of the disaggregated base dies 204A-B. Consequently, costs associated with fabricating a stacked semiconductor die architecture like the architecture 200 can be reduced because one or more of the disaggregated base dies 204A-B will be less likely to exhibit decreased yield than a monolithic base die 104 that is in the architecture 100 of FIG. 1. Also, performance of a semiconductor package that includes the architecture 200 may be improved (when compared to performance of a semiconductor package that includes the architecture 100 described above in connection with FIG. 1). This improved performance is because one or more of the disaggregated base dies 204A-B will be less likely to exhibit decreased yield than a monolithic base die 104 that is in the architecture 100 of FIG. 1.

Furthermore, and as explained above with regard to FIG. 1, the conventional assembly operation used to mount the stacked semiconductor dies 102 onto the monolithic base die 104 includes multiple joining operations that are collectively a time-intensive exercise. This exercise can increase the time and costs associated with fabricating the architecture 100. In contrast, the architecture 200 shown in FIG. 2A includes an assembly operation that requires relatively less time to complete than the conventional assembly operation used for the architecture 100.

In one embodiment, assembling the stacked semiconductor dies 202 to one or more of the disaggregated bases 204A-B includes two operations: a placement operation and a joining operation. The placement operation includes placing the carrier wafer 206 that includes the stacked semiconductor dies 202 on one or more of the disaggregated base dies 204A-B. Next, and for this embodiment, the joining operation includes multiple joining operations—that is, a joining operation is performed for one or more of the disaggregated base dies 204A-B (as opposed to a joining operation for each of the stacked semiconductor dies 202). Thus, the joining operation used for the architecture 200 according to the embodiments described here is performed once per disaggregated base die, rather than once per stacked semiconductor die, which can result in relatively lower operation times and costs (than the operation times and costs of at least one conventional joining operation).

In view of the descriptions provided herein, and for one embodiment, a stacked semiconductor die architecture 200 having a plurality of disaggregated base dies 204A-B can be fabricated at a relatively lower cost than a stacked semiconductor die architecture having a single monolithic base die. Another advantage attributable to one or more embodiments of a stacked semiconductor die architecture 200 having a plurality of disaggregated base dies 204A-B is that one or more of the disaggregated base dies 204A-B can contain voltage regulators, power gates, and input/output (I/O) components that might be too defect-sensitive on a much larger monolithic base die.

For one embodiment of the architecture 200, the carrier wafer may be a passive carrier wafer. As used herein, a "passive carrier wafer" refers to a carrier wafer that includes one or more interconnect structures (e.g., wires, bumps, microbumps, pillars, etc.) and/or one or more passive semiconductor devices, but no active semiconductor device. Passive carrier wafers are described in further detail below in connection with FIG. 3.

Figure 2B:
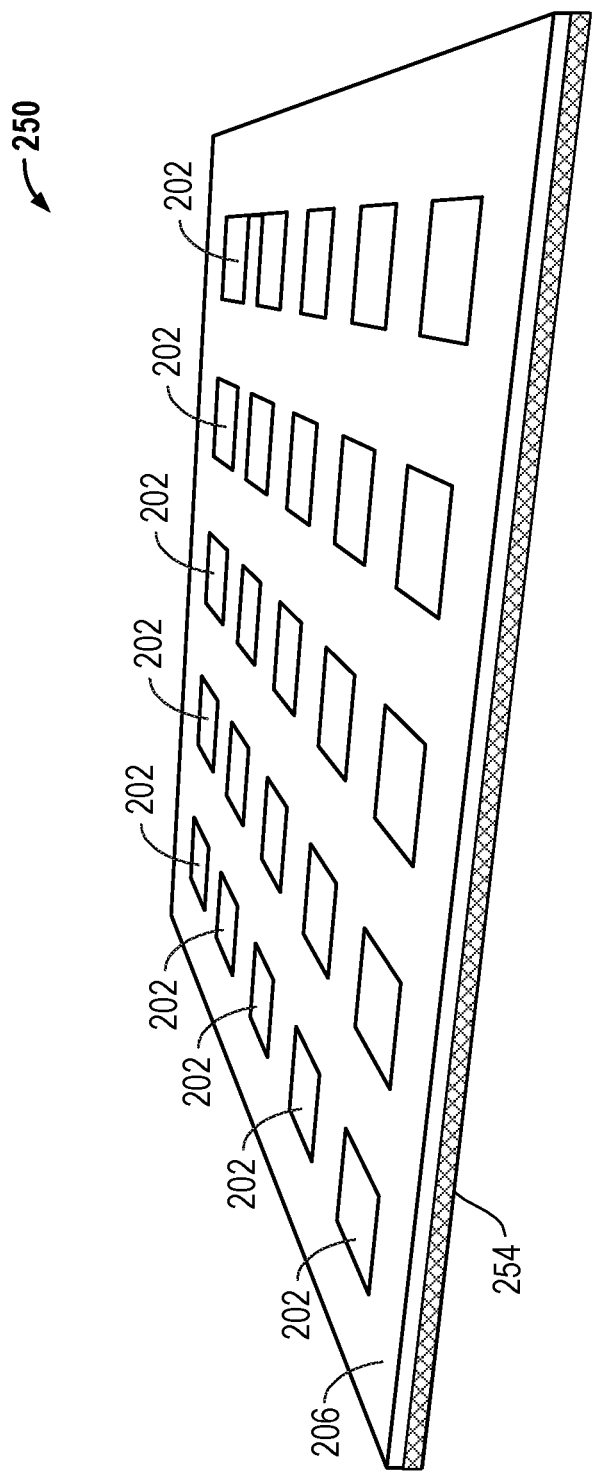

Reference is now made to FIG. 2B, which illustrates a stacked semiconductor die architecture 250 in accordance with an embodiment. As shown, the architecture 200 includes a carrier wafer 206 (with cavities formed therein), a plurality of stacked semiconductor dies 202, and a monolithic base die 254. The architecture 250 of FIG. 2B includes many of the same components as those described above in connection with the architecture 200 of FIG. 2A. For brevity, these components are not described again unless such description is required to understand the architecture 250. Furthermore, only differences between the architecture 250 of FIG. 2B and the architecture 200 of FIG. 2A are described below in connection with FIG. 2B.

One difference between the architectures 250 and 200 is that the architecture 250 includes a monolithic base die 254, while the architecture 200 includes one or more disaggregated base dies 204A-B. For one embodiment of the architecture 250, the carrier wafer 206 includes one or more passive semiconductor devices that assist with improving the yield of the monolithic base die 254. In this way, the architecture 250 represents an improvement over the architecture 100 described above in connection with FIG. 1. The carrier wafer 206 and stacked semiconductor die(s) 202 are described in connection with FIG. 2A.

For one embodiment of the architecture 250, a surface area of the carrier wafer 206 can be equal to or larger than surface areas of the plurality of stacked semiconductor dies 202 and/or a surface area of the monolithic base die 254. Also, a total surface area of the monolithic base die 254 can be equal to or larger than surface areas of one or more dies in the plurality of stacked semiconductor dies 202. For a first example, a surface area of the monolithic base die 254 is equal to or larger than a surface area of one of the plurality of stacked semiconductor dies 202. For a second example, a surface area of the carrier wafer 206 can be equal to or larger than a surface area of the monolithic base die 254. For a third example, a surface area of the monolithic base die 254 is equal to or greater than a total surface area of the plurality of stacked semiconductor dies 202. It is to be appreciated that other examples are possible.

As explained above, the conventional architecture 100 shown in FIG. 1 includes a monolithic base die 104 whose yield decreases as the number of stacked semiconductor dies 102 placed or mounted on the monolithic base die 104 increases. The architecture 250 can assist with minimizing or eliminating this problem. This is because, for one embodiment, the carrier wafer 206 includes one or more passive semiconductor devices that assist with improving the yield of the monolithic base die 254. Consequently, costs associated with fabricating a stacked semiconductor die architecture like the architecture 250 can be reduced because the monolithic base die 254 will be less likely to exhibit decreased yield than a monolithic base die 104 that is in the architecture 100 of FIG. 1. Also, performance of a semiconductor package that includes the architecture 250 may be improved (when compared to performance of a semiconductor package that includes the architecture 100 described above in connection with FIG. 1). This improved performance is because the monolithic base 254 will be less likely to exhibit decreased yield than a monolithic base die 104 that is in the architecture 100 of FIG. 1.

Furthermore, and as explained above with regard to FIG. 1, the conventional assembly operation used to mount the stacked semiconductor dies 102 onto the monolithic base die 104 includes multiple joining operations that are collectively a time-intensive exercise. This exercise can increase the time and costs associated with fabricating the architecture 100. In contrast, the architecture 250 shown in FIG. 2B includes an assembly operation that requires relatively less time to complete than the conventional assembly operation used for the architecture 100. In one embodiment, assembling the stacked semiconductor dies 202 to the monolithic base die 254 includes two operations: a placement operation and a joining operation. Each of these operations is described above in connection with FIG. 2A.

For one embodiment of the architecture 250, the carrier wafer may be a mechanical carrier wafer. As used herein, a "mechanical carrier wafer" refers to a carrier wafer that does not include any interconnect structures (e.g., wires, bumps, microbumps, pillars, etc.) and/or active or passive semiconductor devices. For another embodiment of the architecture 250, the carrier wafer may be a passive carrier wafer.

Figure 3:
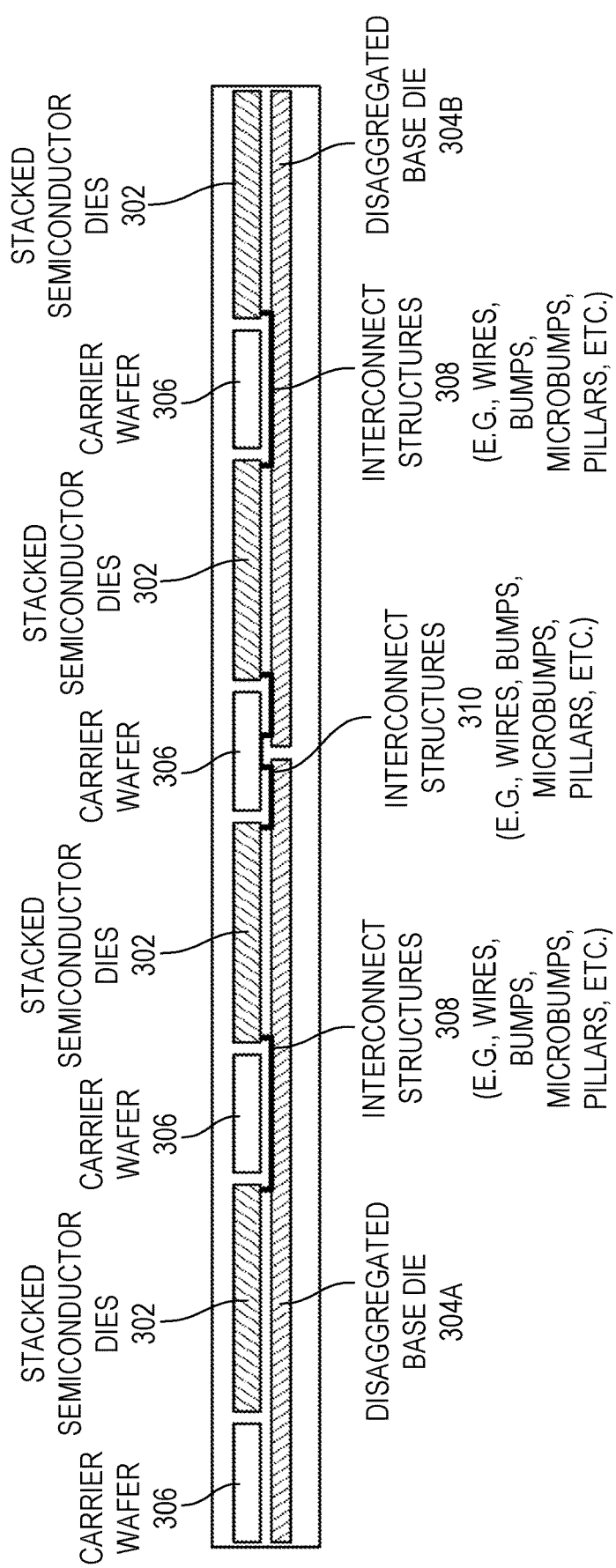
FIG. 3 is a cross-sectional side view illustration of a plurality of stacked dies on one or more disaggregated base dies that are coupled to each other by a carrier wafer having the plurality of stacked dies embedded therein, according to one embodiment.

With regard now to FIG. 3, which shows a cross-sectional side view illustration of a plurality of stacked semiconductor dies 302 on multiple disaggregated base dies 304A-B that are coupled to each other by a carrier wafer 306 having the plurality of stacked dies 302 embedded therein, according to one embodiment.

As shown in FIG. 3, multiple stacked semiconductor dies 302 are stitched together with interconnect structures 308 on multiple disaggregated base die 304A-B, and multiple disaggregated base die 304A-B are stitched together with interconnect structures 310 on the carrier wafer 306. The interconnect structures 308 and 310 (e.g., wires, bumps, microbumps, pillars, etc.) can be formed from any relevant materials known in the art.

For one embodiment, the interconnect structures 310 comprise mechanical and/or electrical connections (e.g., wires, etc.) on the carrier wafer 306 for coupling or stitching a plurality of disaggregated base dies 304A-B together. For a further embodiment, the interconnect structures 310 (e.g., wires, etc.) enable the carrier wafer and one or more of the plurality of disaggregated base dies 304A-B to be coupled (e.g., electrically coupled, mechanically coupled, etc.) to each other.

For one embodiment, the interconnect structures 310 include interconnects (e.g., bumps, microbumps, pillars, etc.) on one or more of the disaggregated base dies 304A-B. For this embodiment, the interconnect structures 310 enable coupling (e.g., electrical coupling, mechanical coupling, etc.) of: (i) one or more of the stacked semiconductor dies 302; and (ii) at least one of the disaggregated base dies 304A-B.

For one embodiment, the immediately preceding embodiments of the interconnect structures 310 are combined. In this way, two or more of the following are coupled (e.g., electrically coupled, mechanically coupled, etc.) to each other: (i) the carrier wafer; (ii) one or more of the stacked semiconductor dies 302; and (iii) at least one of the disaggregated base dies 304A-B.

For one embodiment, the interconnect structures 308 comprise mechanical and/or electrical connections (e.g., wires, etc.) and/or interconnects (e.g., bumps, microbumps, pillars, etc.) that are disposed or formed in or on one or more of the disaggregated base dies 304A-B. For this embodiment, the interconnect structures 308 enable coupling or stitching a plurality of stacked semiconductor dies 302 together. For a further embodiment, the interconnect structures 308 enable at least one of the disaggregated base dies 304A-B and one or more of the plurality of stacked semiconductor dies 302 to be coupled (e.g., electrically coupled, mechanically coupled, etc.) to each other.

For one embodiment, the immediately preceding embodiments of the interconnect structures 308 and 310 are combined. In this way, two or more of the following are coupled (e.g., electrically coupled, mechanically coupled, etc.) to each other: (i) the carrier wafer; (ii) one or more of the stacked semiconductor dies 302; and (iii) at least one of the disaggregated base dies 304A-B.

The carrier wafer 306 can be a passive carrier wafer. Examples of a passive carrier wafer include, but are not limited to, one or more of the following: (i) a carrier wafer that includes one or more electrical connections formed therein (e.g., wires, etc.) but no active or passive semiconductor device and/or interconnects (e.g., bumps, microbumps, pillars, etc.); (ii) a carrier wafer that includes electrical connection(s) formed therein and one or more passive semiconductor devices (e.g., a resistor, a capacitor, an inductor, etc.), but no active semiconductor device; and (iii) a carrier wafer that includes electrical connection(s) formed therein, interconnects (e.g., bumps, microbumps, pillars, etc.), and passive semiconductor device(s), but no active semiconductor device. In one embodiment, the carrier wafer 306 is a passive carrier wafer with electrical connections formed therein (e.g., wires, etc.) that are inherently short, which could assist with making passive connections available (even at fairly high data rates).

The disaggregated base dies 304A-B may assist with building relatively larger arrays of stacked semiconductor dies 302 than was previously available. In one embodiment, disaggregation of the base dies 304A-B from a larger monolithic base die can assist with creating a stacked silicon architecture that is larger than the reticle limit. As is known, the reticle limit constrains sizes of dies used in stacked semiconductor die architectures. In some embodiments, the carrier wafer 306 can be optimized (e.g., with the inclusion of at least one passive semiconductor device, etc.) to improve or maintain the yield of one or more of the disaggregated base dies 304A-B.

One issue associated with conventional stacked semiconductor die architectures is that cooling capacity limits the number of compute elements (cores) that can run simultaneously within a given thermal envelope. Advantageously, one embodiment described herein can assist with providing compute elements (e.g., one or more stacked semiconductor dies, etc.) with a relatively larger X-Y area than was previously available. For this embodiment, the intervening spaces between compute elements are filled with thermally conductive silicon that is planarized with the stacked semiconductor dies. The filling and planarization operations can assist with increasing the number of compute elements that can run simultaneously within a given thermal envelope. The filling operation can also assist with improving FIVR efficiency and increasing the cache per compute.

Figure 4A:
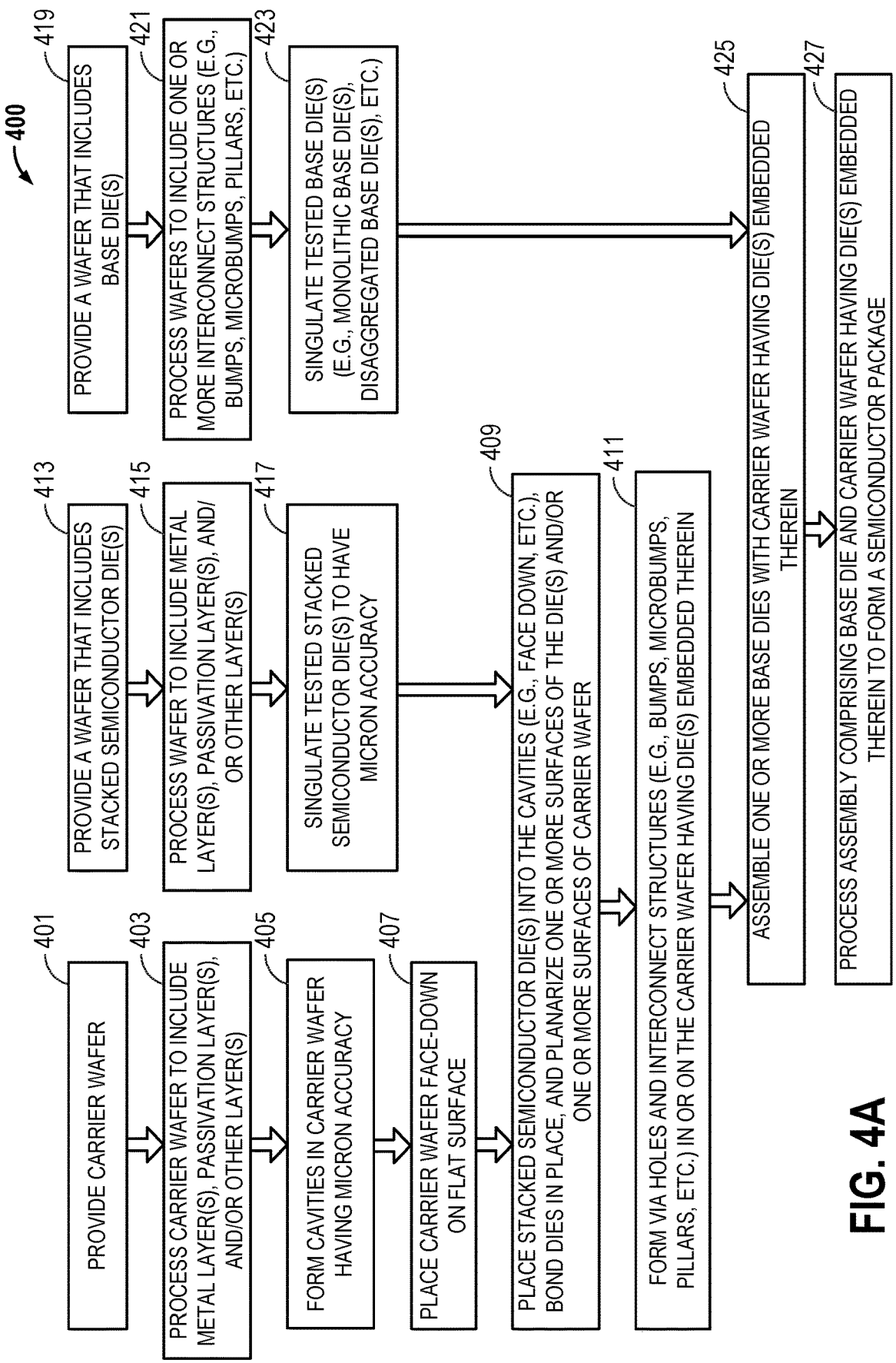
FIGS. 4A-4B are process flow illustrations of methods of building a plurality of stacked semiconductor dies on one or more base dies that are coupled to each other by a carrier wafer having the plurality of stacked dies embedded therein, according to one or more embodiments.

FIG. 4A is a process flow illustration of a method 400 of building a plurality of stacked semiconductor dies on one or more base dies that are coupled to each other by a carrier wafer having the plurality of stacked dies embedded therein, according to one embodiment. The method 400 begins at blocks 401, 413, or 419. At block 401, a carrier wafer is provided. At block 403, one or more metal layers are formed on the carrier wafer. Metal layer(s) may be formed from a metal, a metal alloy, or any other suitable material. Also, block 403 may include forming one or more passivation layers on the metal layer(s) on the carrier wafer. Passivation layers may be formed from a dielectric material or any other suitable material. Next, at block 405, cavities are formed in the carrier wafer. The cavities may be formed to have micron accuracy. Any suitable technique may be used to form the cavities. Techniques for forming the cavities include, but are not limited to, one or more of the following: deep reactive-ion etching (DRIE) techniques (e.g., cryogenic DRIE process, Bosch DRIE process, etc.); laser etching; and any other suitable technique known in the art. At block 407, the carrier wafer is placed face down on a flat surface.

The method 400 also includes block 413, where a wafer that includes one or more stacked semiconductor dies (stacked semiconductor die wafer) is received or provided. At block 415, one or more metal layers may be formed on the stacked semiconductor die wafer. Also, and at block 415, one or more passivation layers are formed on the metal layer(s) on the stacked semiconductor die wafer. One or more other layers, as is known in the art, may also be formed on the metal and/or passivation layer(s). The stacked semiconductor die wafer may also be tested. Next, at block 417, the stacked semiconductor die wafer is singulated to form individual stacked semiconductor dies. The dies may be singulated to have micron accuracy. The singulated stacked semiconductor dies may be tested.

The method 400 also includes block 419, where a wafer that includes one or more base dies (base die wafer) is received or provided. At block 421, interconnect structures (e.g., bumps, microbumps, pillars, etc.) are formed on the base die wafer. The base die wafer may be tested. Next, at block 423, the base die wafer is singulated to form multiple base dies (e.g., one or more monolithic base dies, one or more disaggregated base dies, etc.).

The method 400 also includes block 409. Here, the stacked semiconductor dies from block 417 are placed into the cavities formed in the carrier wafer. In some embodiments, the stacked semiconductor dies are bonded to the cavities in carrier wafer. In some embodiments, one or more surfaces of the stacked semiconductor dies and/or the carrier wafer are planarized such that top and/or bottom surfaces of the stacked semiconductor dies are co-planar with top and/or bottom surfaces of the carrier wafer. These surfaces may include the metal layer(s), passivation layer(s), and/or other layer(s) described above in connection with blocks 403 and 415. At block 411, via holes are formed in the carrier wafer that includes the stacked semiconductor dies. For one embodiment, the via holes are formed by etching or cutting the layer(s) on the carrier wafer and/or the stacked semiconductor dies embedded in the carrier wafer. For a specific embodiment, the via holes are formed by etching or cutting the passivation layer(s) on the carrier wafer and/or the stacked semiconductor dies embedded in the carrier wafer to expose the metal layer(s). Furthermore, the block 411 may include forming one or more interconnect structures (e.g., wires, bumps, microbumps, pillars, etc.) in or on the carrier wafer having the stacked semiconductor dies embedded therein. For a specific embodiment, the block 411 includes forming one or more bumps (e.g., metal bumps, copper bumps, etc.) in or on the carrier wafer having stacked semiconductor dies embedded therein.

For one embodiment, the via holes and the interconnect structures are formed using any suitable technique known in the art. For a specific embodiment, formation of all the via holes in the carrier wafer having stacked semiconductor dies embedded therein is performed in a single operation such that all the via holes are aligned. That is, a single operation that does not require formation of via holes using multiple operations (e.g., a process comprised of multiple operations that are performed in a sequential order, where each operation includes forming an individual via hole, etc.). For this embodiment, because the via holes are formed to all stacked semiconductor dies embedded in the carrier wafer using a single operation, tolerance inaccuracies inherent in singulation of the stacked semiconductor dies (block 417), in forming cavities in the carrier wafer (block 405), and/or in placement of stacked semiconductor dies in the cavities (block 409) may be reduced. In this way, one or more unwanted effects associated with the tolerance inaccuracies may be minimized or eliminated such that these tolerance inaccuracies do not affect placement or formation of interconnect structures (e.g., bumps, microbumps, pillars, etc.) on the carrier wafer having stacked semiconductor dies embedded therein.

At block 425, one or more of the base dies formed at block 423 are assembled with the carrier wafer having stacked semiconductor dies embedded therein to form an assembly (i.e., a stacked semiconductor die architecture). For a first example, one or more of the base dies formed at block 423 are disposed or mounted on the carrier wafer having the embedded stacked semiconductor dies. For a second example, the carrier wafer having the embedded stacked semiconductor dies is disposed or mounted on one or more of the base dies formed at block 423. Next, at block 427, further processing of the assembly (i.e., the stacked semiconductor die architecture) comprising the carrier wafer having stacked semiconductor dies embedded therein and the base die(s) is performed until a semiconductor package is formed. This further processing can include die stacking operations, 3D stacking operations, encapsulation operations, planarization operations, forming redistribution layers, attaching additional components or packages, etc.

Figure 4B:
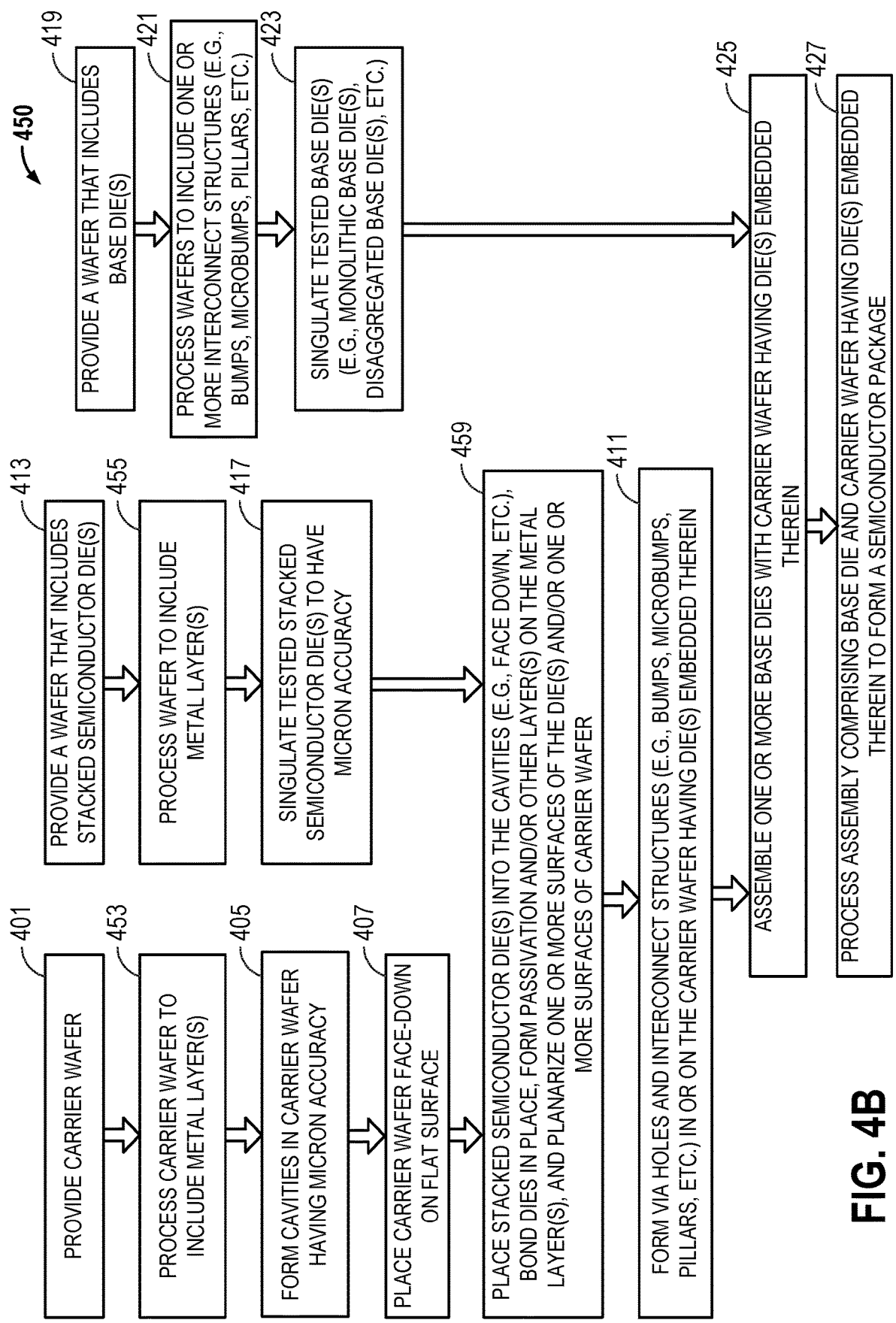

FIG. 4B is a process flow illustration of a method 450 of building a plurality of stacked semiconductor dies on one or more base dies that are coupled to each other by a carrier wafer having the plurality of stacked dies embedded therein, according to one embodiment. The method 450 includes many operations (i.e., blocks) that are similar to or the same as the operations (i.e., blocks) described above in connection with the method 400 of FIG. 4A. For brevity, these operations are not described again unless such description is needed to understand the method 450. Also, only differences between the method 400 and the method 450 are described below in connection with FIG. 4B.

One difference between the method 400 and the method 450 is that the method 450 includes blocks 453, 455, and 459 (instead of blocks 403, 415, and 409 of the method 400 that are described above in connection with FIG. 4A). Block 453 differs from the block 403 described above in connection with FIG. 4A because block 453 does not include forming one or more passivation and/or other layers on the metal layer(s) on the carrier wafer. Block 455 differs from the block 415 described in connection with FIG. 4A because block 455 does not include forming one or more one or more passivation and/or other layers on the metal layer(s) on the stacked semiconductor die wafer. Block 459 is different from the block 409 of the method 400 in FIG. 4A because the block 459 includes forming one or more passivation and/or other layers after the stacked semiconductor dies from block 417 are placed into the cavities formed in the carrier wafer and/or bonded to the cavities.

The method 450 begins at blocks 401, 413, or 419 (all of which are described above in connection with the method 400 of FIG. 4A). At block 453, one or more metal layers are formed on the carrier wafer. Metal layer(s) may be formed from a metal, a metal alloy, or any other suitable material. Block 453 differs from the block 403 described in connection with FIG. 4A because block 453 does not include forming one or more passivation and/or other layers on the metal layer(s) on the carrier wafer. Next, at block 405, cavities are formed in the carrier wafer, as described above in connection with the method 400 of FIG. 4A. At block 407, the carrier wafer is placed face down on a flat surface, as described above in connection with the method 400 of FIG. 4A.

The method 450 also includes block 413, where a wafer that includes one or more stacked semiconductor dies (stacked semiconductor die wafer) is received or provided. At block 455, one or more metal layers may be formed on the stacked semiconductor die wafer. Block 455 differs from the block 415 described in connection with FIG. 4A because block 455 does not include forming one or more passivation and/or other layers on the metal layer(s) on the stacked semiconductor die wafer. The stacked semiconductor die wafer may also be tested. Next, at block 417, the stacked semiconductor die wafer is singulated to form individual stacked semiconductor dies, as described above in connection with the method 400 of FIG. 4A. The dies may be singulated to have micron accuracy. The singulated stacked semiconductor dies may be tested.

The method 450 also includes block 419, where a wafer that includes one or more base dies (base die wafer) is received or provided (as described above in connection with the method 400 of FIG. 4A). At block 421, one or more interconnect structures (e.g., bumps, microbumps, pillars, etc.) are formed on the base die wafer (as described above in connection with the method 400 of FIG. 4A). The base die wafer may be tested. Next, at block 423, the base die wafer is singulated to form multiple base dies (e.g., one or more monolithic base dies, one or more disaggregated base dies, etc.), as described above in connection with the method 400 of FIG. 4A.

The method 450 also includes block 459. Here, the stacked semiconductor dies from block 417 are placed into the cavities formed in the carrier wafer (as described above). In some embodiments, the stacked semiconductor dies are bonded to the cavities in carrier wafer. In some embodiments, one or more passivation layers are formed after the stacked semiconductor dies from block 417 are placed into the cavities formed in the carrier wafer and/or bonded to the cavities. One or more other layers, as is known in the art, may also be formed over the passivation layer(s). In this embodiment, the passivation and/or other layer(s) can be controlled to have a uniform z-height over the carrier wafer having the stacked semiconductors dies embedded therein. Passivation layers may be formed from dielectric materials or any other suitable materials. The block 459 is different from the block 409 of the method 400 in FIG. 4A because the block 459 includes forming one or more passivation and/or other layers after the stacked semiconductor dies from block 417 are placed into the cavities formed in the carrier wafer and/or bonded to the cavities.

In some embodiments of the method 450, one or more surfaces of the stacked semiconductor dies and/or the carrier wafer are planarized such that top and/or bottom surfaces of the stacked semiconductor dies are co-planar with top and/or bottom surfaces of the carrier wafer. These surfaces may include the metal and/or passivation layer(s) described above in connection with blocks 453, 455, and 459. At block 411, via holes are formed in the carrier wafer that includes the stacked semiconductor dies, as described above in connection with the method 400 of FIG. 4A. Furthermore, the block 411 may include forming one or more interconnect structures (e.g., bumps, microbumps, pillars, etc.) on the carrier wafer having the stacked semiconductor dies embedded therein, as described above in connection with the method 400 of FIG. 4A. For one embodiment of the method 450, the via holes and the interconnect structures are formed using any suitable technique known in the art. For a specific embodiment of the method 450, formation of all the via holes in the carrier wafer having stacked semiconductor dies embedded therein is performed in a single operation such that all the via holes are aligned, as described above in connection with the method 400 of FIG. 4A.

At block 425, one or more of the base dies formed at block 423 are assembled with the carrier wafer having stacked semiconductor dies embedded therein to form an assembly (i.e., a stacked semiconductor die architecture), as described above in connection with the method 400 of FIG. 4A. Next, at block 427, further processing of the assembly (i.e., the stacked semiconductor die architecture) comprising the carrier wafer having stacked semiconductor dies embedded therein and the base die(s) is performed until a semiconductor package is formed, as described above in connection with the method 400 of FIG. 4A.

Figure 5:
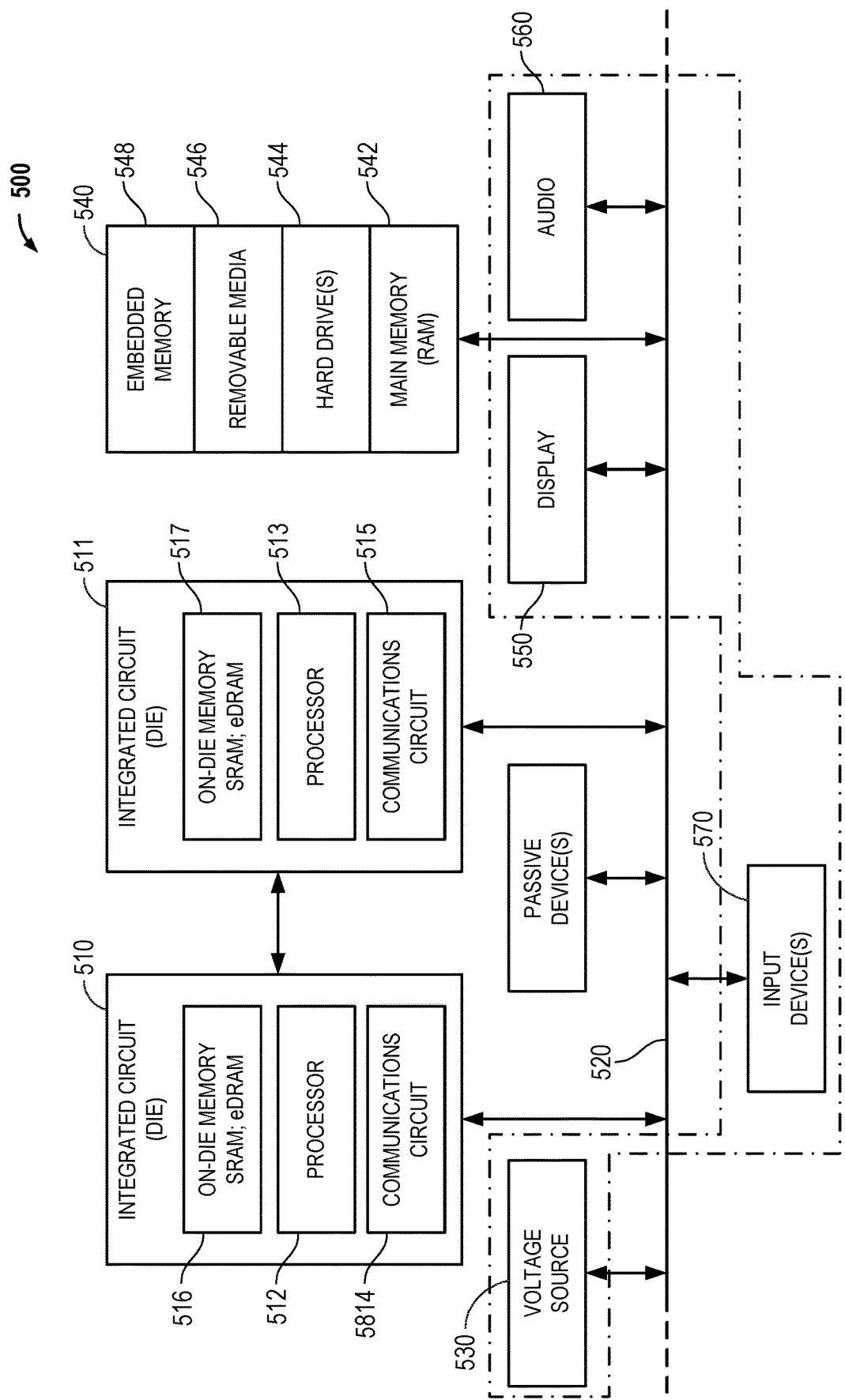
FIG. 5 is an illustration of a schematic block diagram of a computer system that utilizes a semiconductor package having a stacked semiconductor architecture, according to an embodiment.

FIG. 5 illustrates a schematic of computer system 500 according to an embodiment. The computer system 500 (also referred to as an electronic system 500) can include a semiconductor package that includes a stacked semiconductor die architecture in accord with any of the embodiments and their equivalents as set forth in this disclosure. The computer system 500 may be a mobile device, a netbook computer, a wireless smart phone, a desktop computer, a hand-held reader, a server system, a supercomputer, or a high-performance computing system.

The electronic system 500 can be a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In one embodiment, the voltage source 530 supplies current to the integrated circuit 510 through the system bus 520.

The integrated circuit 510 is coupled to the system bus 520 and includes any circuit, or combination of circuits according to an embodiment. For an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. For an embodiment, the processor 512 includes, or is coupled with, a semiconductor package that includes a stacked semiconductor die architecture in accord with any of the embodiments and their equivalents, as described in the foregoing specification. For an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. For an embodiment, the integrated circuit 510 includes on-die memory 516 such as static random-access memory (SRAM). For an embodiment, the integrated circuit 510 includes embedded on-die memory 516 such as embedded dynamic random-access memory (eDRAM). For one embodiment, the on-die memory 516 may be packaged with a process in accord with any of the embodiments and their equivalents, as described in the foregoing specification.

For an embodiment, the integrated circuit 510 is complemented with a subsequent integrated circuit 511. Useful embodiments include a dual processor 513 and a dual communications circuit 515 and dual on-die memory 517 such as SRAM. For an embodiment, the dual integrated circuit 510 includes embedded on-die memory 517 such as eDRAM.

For an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

For an embodiment, the electronic system 500 also includes a display device 550 and an audio output 560. For an embodiment, the electronic system 500 includes an input device such as a controller 570 that may be a keyboard, mouse, trackball, game controller, microphone, voice-recognition device, or any other input device that inputs information into the electronic system 500. For an embodiment, an input device 570 is a camera. For an embodiment, an input device 570 is a digital sound recorder. For an embodiment, an input device 570 is a camera and a digital sound recorder.

At least one of the integrated circuits 510 or 511 can be implemented in a number of different embodiments, including a semiconductor package that includes a stacked semiconductor die architecture as described herein, an electronic system, a computer system, one or more methods of fabricating an integrated circuit, and one or more methods of fabricating an electronic assembly that includes a semiconductor package that includes a stacked semiconductor die architecture, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any semiconductor package process that includes forming a stacked semiconductor die architecture in accordance with any of the several disclosed embodiments as set forth herein and their art-recognized equivalents. A foundation substrate may be included, as represented by the dashed line of FIG. 5. Passive devices may also be included, as is also depicted in FIG. 5.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or Figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to avoid obscuring embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a stacked semiconductor architecture for a semiconductor package, comprising: one or more base dies; and a carrier wafer on the one or more base dies, the carrier wafer including a plurality of dies, wherein one or more interconnect structures couple the plurality of dies and the one or more base dies to each other.

Additional embodiments include a stacked semiconductor architecture for a semiconductor package, wherein the carrier wafer has a surface area that exceeds a total surface area of the one or more base dies.

Additional embodiments include a stacked semiconductor architecture for a semiconductor package, wherein the one or more base dies comprises a plurality of base dies and wherein one or more interconnect structures couple the carrier wafer to the plurality of base dies.

Additional embodiments include a stacked semiconductor architecture for a semiconductor package, wherein at least one of the plurality of dies in the carrier wafer are coupled to at least one of the one or more base dies with one or more microbumps.

Additional embodiments include a stacked semiconductor architecture for a semiconductor package, wherein the one or more base dies comprise one or more of: (i) at least one monolithic base die; and (ii) at least one disaggregated base die.

Additional embodiments include a stacked semiconductor architecture for a semiconductor package, wherein each of the plurality of dies in the carrier wafer is coupled to another one of the plurality of dies in the carrier wafer using an interconnect structure.

Additional embodiments include a stacked semiconductor architecture for a semiconductor package, wherein top sides of the dies in the carrier wafer are co-planar with a top side of the carrier wafer.

Additional embodiments include a stacked semiconductor architecture for a semiconductor package, wherein at least one of the plurality of dies in the carrier wafer is a memory die.

Embodiments described herein include a method of forming a stacked semiconductor architecture for a semiconductor package, comprising: disposing a carrier wafer on one or more disaggregated base dies, the carrier wafer including a plurality of dies, wherein one or more interconnect structures couple the plurality of dies and the one or more base dies to each other.

Additional embodiments include a method, wherein the carrier wafer has a surface area that exceeds a total surface area of the one or more base dies.

Additional embodiments include a method, wherein the one or more base dies comprises a plurality of base dies and wherein one or more interconnect structures couple the carrier wafer to the plurality of base dies.

Additional embodiments include a method, wherein at least one of the plurality of dies in the carrier wafer are coupled to at least one of the one or more base dies with one or more microbumps.

Additional embodiments include a method, wherein the one or more base dies comprise one or more of: (i) at least one monolithic base die; and (ii) at least one disaggregated base die.

Additional embodiments include a method, further comprising forming a plurality of disaggregated base dies from at least one monolithic base die.

Additional embodiments include a method, further comprising forming a plurality of disaggregated base dies from at least one monolithic base die, wherein the one or more base dies comprise one or more of: (i) at least one monolithic base die; and (ii) at least one of the plurality of disaggregated base dies.

Additional embodiments include a method, wherein each of the plurality of dies in the carrier wafer is coupled to another one of the plurality of dies in the carrier wafer using an interconnect structure.

Additional embodiments include a method, wherein top sides of the dies in the carrier wafer are co-planar with a top side of the carrier wafer.

Additional embodiments include a method, wherein at least one of the plurality of dies in the carrier wafer is a memory die.

Additional embodiments include a method, further comprising: forming cavities in the carrier wafer; and placing the plurality of dies in the cavities.

Additional embodiments include a method, further comprising bonding the plurality of dies to the carrier wafer.

Additional embodiments include a method, further comprising planarizing a top side of the carrier wafer and at least one top side of the plurality of dies in the carrier wafer.

Additional embodiments include a method, further comprising, for each of the one or more base dies, forming one or more microbumps in or on a top side of the disaggregated base die.

Additional embodiments a stacked semiconductor architecture, wherein the carrier wafer is a mechanical carrier wafer or a passive carrier wafer.

Additional embodiments include a stacked semiconductor architecture, wherein, when the carrier wafer is a passive carrier wafer, the carrier wafer comprises at least one passive semiconductor device.

Additional embodiments include a method, wherein the carrier wafer is a mechanical carrier wafer or a passive carrier wafer.

Additional embodiments include a method, wherein, when the carrier wafer is a passive carrier wafer, the carrier wafer comprises at least one passive semiconductor device.

Additional embodiments include a semiconductor package formed according to a method as described above in any of the preceding paragraphs.

In the description, drawings, and claims provided herein, the use of "at least one of A, B, and C", "at least one of A, B, or C", "one or more of A, B, or C", or "one or more of A, B, and C" is intended encompass: (i) A alone; (ii) B alone; (iii) C alone; (iv) A and B together; (v) A and C together; (vi)

B and C together; or (vii) A, B, and C together. Furthermore, the use of "A, B, and/or C" is intended encompass: (i) A alone; (ii) B alone; (iii) C alone; (iv) A and B together; (v) A and C together; (vi) B and C together; or (vii) A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For a first example, the phrase "A or B" will be understood to include the possibilities of "A" or "B" or "A and B." For a second example, the phrase "A and B" will be understood to include the possibilities of "A" or "B" or "A and B." For a third example, the phrase "A and/or B" will be understood to include the possibilities of "A" or "B" or "A and B."

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A stacked semiconductor architecture for a semiconductor package, comprising:
    a first base die and a second base die; and
    a carrier wafer on the first base die and the second base die, the carrier wafer including a first plurality of dies entirely within a footprint of the first base die and a second plurality of dies within a footprint of the second base die, wherein the carrier wafer electrically couples the first base die to the second base die with first interconnect structures, and wherein one or more second interconnect structures couple one or more of the first plurality of dies or the second plurality of dies and one or more of the first base die or the second base die, the one or more second interconnect structures laterally adjacent to the first interconnect structures.

2. The stacked semiconductor architecture of claim 1, wherein the carrier wafer has a surface area that exceeds a total surface area of the first base die and the second base die.

3. The stacked semiconductor architecture of claim 1, wherein the first base die and the second base die comprise one or more of:
    (i) at least one monolithic base die; and
    (ii) at least one disaggregated base die.

4. The stacked semiconductor architecture of claim 1, wherein top sides of the first plurality of dies or the second plurality of in the carrier wafer are co-planar with a top side of the carrier wafer.

5. The stacked semiconductor architecture of claim 1, wherein at least one of the first plurality of dies or the second plurality of dies in the carrier wafer is a memory die.

6. A method of forming a stacked semiconductor architecture for a semiconductor package, comprising:
    disposing a carrier wafer on a first base die and a second base die, the carrier wafer including a first plurality of dies entirely within a footprint of the first base die and a second plurality of dies entirely within a footprint of the second base die, wherein the carrier wafer electrically couples the first base die to the second base die with first interconnect structures, and wherein one or more second interconnect structures couple one or more of the first plurality of dies or the second plurality of dies and one or more of the first base die or the second base die to each other, the one or more second interconnect structures laterally adjacent to the first interconnect structures.

7. The method of claim 6, wherein the carrier wafer has a surface area that exceeds a total surface area of the first base die and the second base die.

8. The method of claim 6, wherein the first base die and the second base die comprise one or more of:
    (i) at least one monolithic base die; and
    (ii) at least one disaggregated base die.

9. The method of claim 6, wherein top sides of the first plurality of dies and the second plurality of dies in the carrier wafer are co-planar with a top side of the carrier wafer.

10. The method of claim 6, wherein at least one of the first plurality of dies or the second plurality of dies in the carrier wafer is a memory die.

11. The method of claim 6, further comprising:
    forming cavities in the carrier wafer; and
    placing the first plurality of dies and the second plurality of dies in the cavities.

12. The method of claim 11, further comprising bonding the first plurality of dies and the second plurality of dies to the carrier wafer.

13. The method of claim 11, further comprising planarizing a top side of the carrier wafer and at least one top side of the first plurality of dies and the second plurality of dies in the carrier wafer.

14. The method of claim 6, further comprising, for each of the first base die and the second base die, forming one or more microbumps on a top side of the first base die or the second base die.

* * * * *